(12) United States Patent
Rakoczi

(10) Patent No.: US 11,209,844 B2
(45) Date of Patent: Dec. 28, 2021

(54) COOLING MODULE FOR A VEHICLE CONTROL UNIT, VEHICLE CONTROL UNIT WITH A COOLING MODULE AND METHOD FOR WATER COOLING A VEHICLE CONTROL UNIT

(71) Applicant: ZF Friedrichshafen AG, Friedrichshafen (DE)

(72) Inventor: Viktor Rakoczi, Immenstaad am Bodensee (DE)

(73) Assignee: ZF Friedrichshafen AG, Friedrichshafen (DE)

( * ) Notice: Subject to any disclaimer, the term of this patent is extended or adjusted under 35 U.S.C. 154(b) by 84 days.

(21) Appl. No.: 16/659,167

(22) Filed: Oct. 21, 2019

(65) Prior Publication Data

US 2020/0128699 A1 Apr. 23, 2020

(30) Foreign Application Priority Data

Oct. 22, 2018 (DE) .......................... 102018218049.0

(51) Int. Cl.
| | |
|---|---|
| *G05D 23/08* | (2006.01) |
| *F28F 13/08* | (2006.01) |
| *H05K 7/20* | (2006.01) |
| *F02D 41/20* | (2006.01) |
| *F28F 13/00* | (2006.01) |

(52) U.S. Cl.
CPC ............ *G05D 23/08* (2013.01); *F28F 13/08* (2013.01); *H05K 7/20272* (2013.01); *H05K 7/20281* (2013.01); *H05K 7/20872* (2013.01); *F01P 2050/30* (2013.01); *F02D 2041/2065* (2013.01); *F28F 2013/008* (2013.01); *F28F 2255/04* (2013.01)

(58) Field of Classification Search
CPC .......... H05K 7/20872; H05K 7/20272; H05K 7/20281; G05D 23/08; G05D 23/2754; H01L 23/3733; H01L 23/3736; F28F 2013/005; F28F 2013/006; F28F 2013/008; F28F 2255/04; F28F 2215/10
USPC .................................................. 165/276, 277
See application file for complete search history.

(56) References Cited

U.S. PATENT DOCUMENTS

| | | | | |
|---|---|---|---|---|
| 3,513,881 A | * | 5/1970 | Kinsell ................. | G05D 23/08 138/45 |
| 3,831,396 A | * | 8/1974 | Donaldson ............ | G21C 15/02 62/467 |

(Continued)

FOREIGN PATENT DOCUMENTS

| | | |
|---|---|---|
| CN | 104159436 A | 11/2014 |
| DE | 2060495 A * | 8/1972 |
| DE | 10 2015 007 799 A1 | 12/2016 |

*Primary Examiner* — Devon Russell
(74) *Attorney, Agent, or Firm* — Crowell & Moring LLP

(57) ABSTRACT

The invention relates to a cooling module for a vehicle control unit, comprising a cooling element, connections for conducting a coolant through the cooling element, a turbulence insert placed in the cooling element comprising at least first cooling fins, and at least one first bimetal located in the cooling element, wherein the at least one first bimetal is placed such that it displaces the at least one group of first cooling fins depending on a temperature-dependent shape change of the at least one first bimetal. The invention also relates to a vehicle control unit with a cooling module and a method for water cooling a vehicle control unit.

9 Claims, 3 Drawing Sheets

(56) References Cited

U.S. PATENT DOCUMENTS

| | | | | |
|---|---|---|---|---|
| 6,016,250 | A | 1/2000 | Hanners | |
| 6,330,157 | B1* | 12/2001 | Bezama | H01L 23/473 |
| | | | | 361/704 |
| 9,841,772 | B2* | 12/2017 | Bucher | H01L 23/36 |
| 10,557,671 | B2* | 2/2020 | Mironets | F28F 13/08 |
| 10,730,645 | B2* | 8/2020 | Mindock | F28D 21/00 |
| 2002/0134542 | A1* | 9/2002 | Unsworth | F28F 1/003 |
| | | | | 165/277 |
| 2009/0321044 | A1* | 12/2009 | Hernon | H01L 23/34 |
| | | | | 165/80.2 |
| 2011/0228478 | A1* | 9/2011 | Takata | F16H 61/0006 |
| | | | | 361/699 |
| 2016/0190038 | A1 | 6/2016 | Koyama et al. | |
| 2017/0038159 | A1* | 2/2017 | Wood | F28F 13/00 |
| 2018/0058327 | A1* | 3/2018 | Tajiri | F02K 3/105 |
| 2018/0092242 | A1* | 3/2018 | Chiu | F28F 13/06 |
| 2019/0067156 | A1* | 2/2019 | Kim | H01L 23/14 |

\* cited by examiner

COOLING MODULE FOR A VEHICLE CONTROL UNIT, VEHICLE CONTROL UNIT WITH A COOLING MODULE AND METHOD FOR WATER COOLING A VEHICLE CONTROL UNIT

RELATED APPLICATIONS

This application claims priority from German Patent Application DE 10 2018 218 049.0, filed Oct. 22, 2018, the entirety of which is hereby incorporated by reference herein.

TECHNICAL FIELD

The invention relates to a cooling module for a vehicle control unit, a vehicle control unit with a cooling module, and a method for water cooling a vehicle control unit.

BACKGROUND

Vehicle control units, electronic control units in English, abbreviated ECU, are also known from the prior art. Vehicle control units comprise hardware platforms for the logical processing of input signals, for obtaining logic and/or power levels for the vehicle control in the form of regulating or control signals. Vehicle control units that regulate and control driver assistance systems and/or automatic/autonomous driving comprise supercomputing hardware platforms in the current prior art. These supercomputing platforms comprise multicore processors comprising numerous central processing units and numerous graphics processors. A multicore processor contains numerous cores on a single chip, i.e. a semiconductor element. Multicore processors reach a high level of computing and can be less expensively implemented in a chip than multiprocessor systems, in which each individual core is located in a processor socket, and the individual processor sockets are located on a main circuit board. The multicore processors process an artificial intelligence, e.g. artificial neural networks, preferably in order to be able to respond intuitively to new driving situations in the manner of a human driver. This is implemented by means of a large computing power. This produces a lot of heat that is to be discharged through cooling. Water is a particularly suitable coolant for vehicle control units due to his high specific thermal capacity.

One requirement for vehicle control units is functionality in temperature ranges of substantially $-40°$ C. to $+9x°$ C. Water only functions in the cold to a certain extent. Normally, ethylene glycol is added to the cooling water, in order to reduce the tendency to freeze, depending on the portion of ethylene glycol. However, at temperatures of $-40°$ C., this requires an ethylene glycol portion of over 50%. This high portion of ethylene glycol unfortunately results, however, in a high dependency between the temperature and viscosity of the coolant. As the temperature decreases, in particular below $-10°$ C., the coolant becomes more viscous, i.e. the viscosity increases. This leads to an undesired decrease in the volumetric flow rate and an increase in pressure. The cooling is inefficient. Compensation for this fluid mechanical parametric volumetric flow rate and pressure could be obtained with a more powerful cooling pump. This would, however, be more complicated and expensive.

SUMMARY

This is the basis of the invention. The fundamental object of the invention is to improve the cooling of vehicle control units.

The invention achieves this with a cooling module for a vehicle control unit that has the features of various claims. The invention also achieves this with a vehicle control unit that has the features of various claims. Moreover, the invention achieves this object with a method for water cooling a vehicle control unit that has the features of various claims.

Further developments and advantageous embodiments are described in the dependent claims.

The cooling module for a vehicle control unit according to the invention comprises a cooling element. The cooling module also comprises connections for conducting a coolant through the cooling element. The cooling module also comprises a turbulence insert located in the cooling element. The turbulence insert comprises at least first cooling fins. The cooling module also comprises at least one first bimetal located in the cooling element. The bimetal is placed such that the at least one group of first cooling fins are displaced, based on a temperature-dependent change in the shape of the at least one first bimetal.

Cooling modules are structural units composed of various components for cooling a device, e.g. a vehicle control unit, wherein the components are dimensioned appropriately with regard to the device that is to be cooled and the given structural space. By way of example, the cooling element can be 210 mm long and 140 mm wide. The connections preferably comprise an intake and an outlet valve. The intake valve is located on a first intake side of the cooling element. The outlet valve is located on an outlet side of the cooling element lying opposite the intake side. With this arrangement, the coolant flows through the cooling element in a substantially straight line. Alternatively, the intake valve and the outlet valve are both located on one side of the cooling element. With this arrangement, the coolant flows through the cooling element in a substantially U-shaped pathway. The coolant is preferably a water and ethylene glycol mixture. A further component of the cooling module comprises cooling fins for improving the heat transfer. The cooling fins or additional components of the cooling module form turbulence inserts for causing turbulence in the coolant. The cooling fins are made of metal, e.g. aluminum and/or copper.

A bimetal comprises two metals with different linear expansion coefficients. The two metals are connected to one another in a material bonded or form fitting manner. If the two ends of the two metals are connected, e.g. with rivets, spot welds, or through shaping, the different temperature dependent expansions result in a bending of the bimetal. The temperature dependent bending of the bimetal and the contact of the bimetal with the cooling fins results in the bimetal functioning as an actuator for displacing the cooling fins. The bimetal functions together with the cooling fins in a manner similar to a membrane or a valve with respect to the coolant. At lower temperatures, the bimetal becomes bowed, and the cooling fins are deformed. In particular, the bimetal pushes the cooling fins toward a housing wall of the cooling element. This opens the valve. At high temperatures, the bimetal assumes a straight, flat state. The cooling fins are substantially drawn entirely into the channel for the coolant. This closes the valve. The flow of the coolant is limited to a specific amount. With an appropriate selection of the metals in the bimetal, a substantially constant volumetric flow rate and constant pressure loss is obtained in the cooling element over a temperature range of $-40°$ C. to $+9x°$ C. This results in a dynamic turbulence insert, with which a clumping of the coolant at low temperatures is avoided, in particular below $-10°$ C. The overall cooling performance of the cooling module is increased by the bimetal. The relatively high masses of the cooling fins can thus be displaced, and the associated friction can then be overcome. A further advantage of the bimetal is its durability due to its low-wear functioning and its suitability as a thermally conductive medium. The bimetal is in preferably in contact with a housing edge of the cooling element such that the thermal conductivity is as high as possible. This can be a metal to metal connection, preferably obtained through welding. As a result, the heat flows not only through the coolant, but also the housing.

The at least one group of first cooling fins are preferably transverse to the longitudinal direction of the cooling element. The central axis of the at least one first bimetal is parallel to the longitudinal direction of the cooling element. Both sides of the at least one first bimetal are connected to the cooling element next to the central axis. A first end of each of the first cooling fins is connected to a first side of the cooling element or a second side thereof, lying opposite the first side. A second end of the first cooling fins is placed on the first bimetal in order to displace the first cooling fins through the temperature dependent bending of the first bimetal. The first side of the cooling element is preferably its lower surface. The second side of the cooling element is preferably its upper surface. The second end of the first cooling fins are loosely placed on the first bimetal, slides over the first bimetal, or is riveted or welded, for example, to the first bimetal. With this assembly, it is possible to displace the cooling fins easily and precisely through the bending of the bimetal. By way of example, an expansion in the range of a tenth of a millimeter to a millimeter, transverse to the flow direction of the coolant, results in a significantly greater vertical displacement, thus toward the upper or lower surface of the cooling element.

In another embodiment of the invention, the cooling element comprises second cooling fins. The second cooling fins are transverse to the longitudinal direction of the cooling element. The cooling module also comprises a second bimetal located in the cooling element. The second bimetal is parallel to the first bimetal. A first end of the second cooling fins is connected to the second side or the first side of the cooling element. A second end of the second cooling fins is located on the second bimetal, analogously to the first cooling fins, in order to displace the second cooling fins through the temperature-dependent bending of the second bimetal. The first cooling fins are connected to the lower surface of the cooling element, for example. The second cooling fins are connected to the upper surface of the cooling element, for example. The first bimetal and the second bimetal are located between the first cooling fins and the second cooling fins, preferably centered in the cooling element. The volumetric flow rate of the coolant can be improved as a result.

The first bimetal bends in a direction opposite the second bimetal. At low temperatures, the first bimetal pushes the first cooling fins toward the lower surface of the cooling element, for example. The second bimetal pushes the second cooling fins toward the upper surface of the cooling element at low temperatures, for example.

Advantageously, the first cooling fins and/or the second cooling fins are each welded or riveted to the cooling element at their first ends.

The first cooling fins and/or the second cooling fins are preferably wavelike. This improves the turbulence in the coolant, and increases the surface area of the first cooling fins and/or the second cooling fins.

The first bimetal and/or second bimetal are preferably in the form of a plate or are particularly preferably in the form of lamella. The lamellar embodiment improves the displacement of the first cooling fins and/or second cooling fins. This improves the cooling process.

According to the invention, a vehicle control unit comprises a cooling module according to the invention. The vehicle control unit is preferably and AD/ADAS domain ECU with artificial intelligence, i.e. a vehicle control unit for a driver assistance system, referred to as an advanced driver assistance system in English, or for automated or autonomous driving functions, referred to as automated or autonomous driving in English. The domain refers to the entire range of the ADAS/AD controlled by the vehicle control unit, in particular the environment detection through environment sensors such as cameras, radar, lidar, ultrasound, microphones, the derivation of a real driving situation, trajectory planning, and vehicle guidance. The hardware platform for the vehicle control unit is configured to process input signals by means of artificial intelligence. For this, the hardware platform comprises graphics processors in particular, configured for parallel computing, preferably in the form of multicore processors.

The cooling module is preferably flange-mounted on the vehicle control unit, in order to ensure heat transfer.

A thermal conductor is advantageously located between the vehicle control unit and the cooling module in order to improve thermal transfer. The thermal conductor is a further component of the cooling module, for example. In particular, the thermal conductor can be a so-called heat spreader that reduces the heat flux density over a large surface area, e.g. a 23×23 mm surface area to the surface area of the palm of a hand. A heat spreader is a thermo-mechanical component, by means of which the heat flux density of a heat source to a heat sink is reduced, due to its special shape, by means of a highly thermal conductive element, e.g. comprising aluminum or copper. In the simplest case, this element can be compared to an inverted pyramid. The heat source is at the lower tip, and the heat sink is at the upper surface.

The performance increases with even greater packing densities of semiconductors, in particular GPUs, such that it is no longer possible to adequately cool them with conventional cooling concepts. The thermal conductor is preferably riveted or welded to the first side of the cooling element. The first cooling fins are likewise riveted or welded to the first side of the cooling element. By riveting or welding the thermal conductor and the first cooling fins, the thermal transition is better than with a loose, sliding connection.

The cooling module or the vehicle control unit are integrated in a cooling circuit of a vehicle, for example, in which other vehicle components and/or other control units are integrated. The cooling circuit is protected against malfunctioning by the turbulence inserts with bimetals according to the invention, which result in an efficient cooling without clumping of the coolant. This improves the availability of the system, and at least reduces impairment of further vehicle components and/or other control units.

The cooling module and/or vehicle control unit are preferably located in a housing. The housing protects the cooling module against mechanical loads, weather effects, and other external effects.

The method according to the invention for water cooling a vehicle control unit comprises the steps:

conducting a coolant through a cooling module, wherein the cooling module is a cooling module according to the invention, and is in thermal contact with the vehicle control unit, generating a turbulent flow of the coolant through the cooling module by means of a turbulence insert, and altering the volumetric flow rate of the coolant through the cooling module.

A water cooling with a substantially constant volumetric flow rate and constant pressure loss is obtained with the method in a temperature range of −40° C. to +9x° C. Clumping of the coolant at low temperatures, in particular below −10° C., is prevented.

BRIEF DESCRIPTION OF THE DRAWINGS

The invention shall now be explained in terms of the exemplary embodiments. In the drawings.

Identical reference symbols indicate identical or functionally similar components in the figures. For purposes of clarity, only the relevant components are indicated in the individual figures.

DETAILED DESCRIPTION

Figure 1:
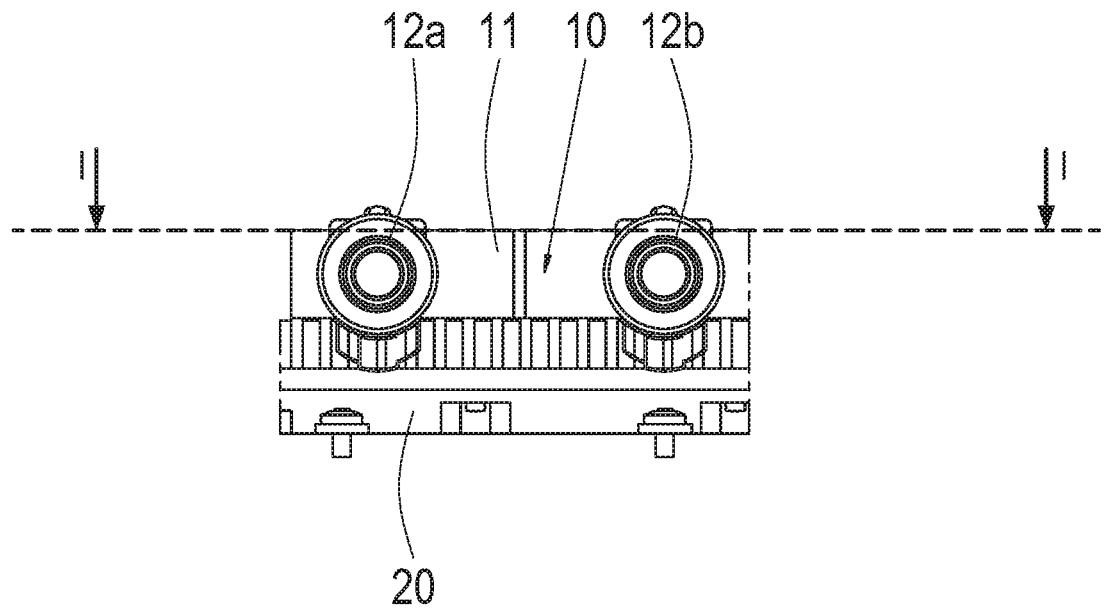
FIG. 1 shows a cross section of an exemplary embodiment of a cooling module according to the invention.

The cooling module 10 in FIG. 1 comprises a cooling element 11. The cooling element 11 has a first side 11a. The first side 11a is a lower surface of the cooling element 11, by way of example, cf. FIG. 3. The cooling element 11 also has a second side 11b. The second side 11b is an upper surface of the cooling element 11, by way of example, cf. FIG. 3. A coolant is conducted through the cooling element 11. The coolant is a water and ethylene glycol mixture, by way of example. The cooling element 11 forms channels, for example, through which the coolant is conducted.

Figure 2:
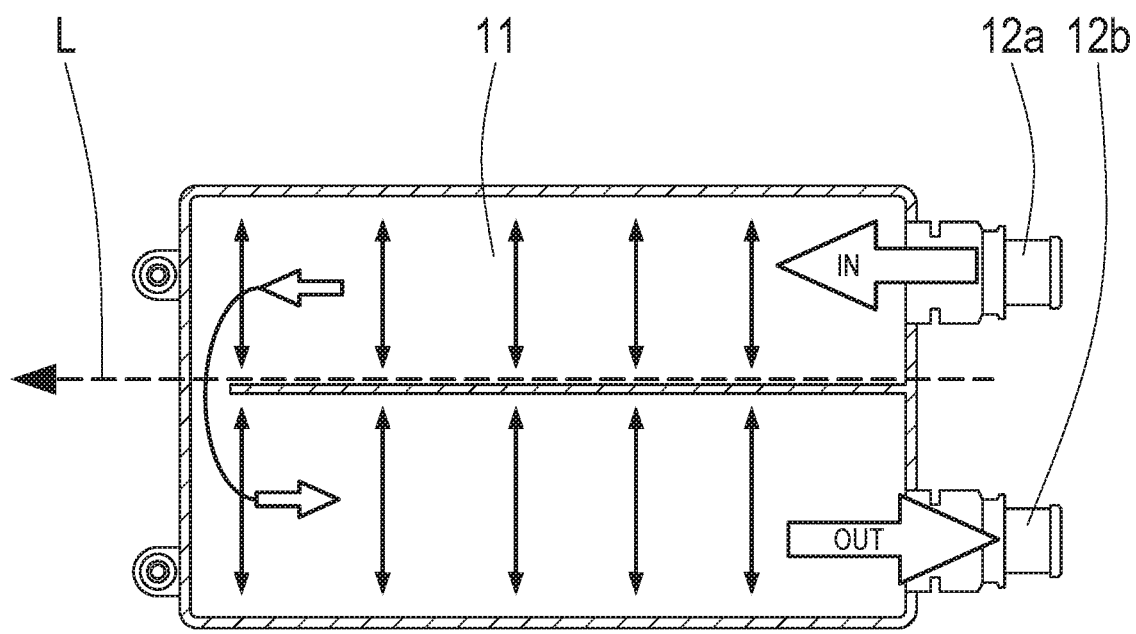
FIG. 2 shows the exemplary embodiment from FIG. 1, cut along line I.

A U-shaped channel is shown by way of example in FIG. 2. Alternatively, additional channels or upright pins are placed in the region of the first connection 12a and/or second connection 12b, for conducting the coolant in a targeted manner through the cooling element 11 or for homogenizing the coolant in the cooling element 11. The bidirectional arrows in the cooling element 11 shown in FIG. 2 indicate the direction of expansion of a first bimetal 14a and second bimetal 14b between the respective securely riveted or welded end points thereof, cf. FIG. 3. The cooling module 10 comprises a first connection 12a. The coolant is conducted into the cooling element 11 via the first connection 12a. The first connection 12a is in the form of an intake valve. The cooling module 10 comprises a second connection 12b. The coolant is conducted out of the cooling element via the second connection 12b. The second connection 12b is in the form of an outlet valve.

The cooling module 10 is flange-mounted on the vehicle control unit 20 in the figures, wherein a thermal conductor 15 is located between the cooling module 10 and the vehicle control unit 20.

Figure 3:
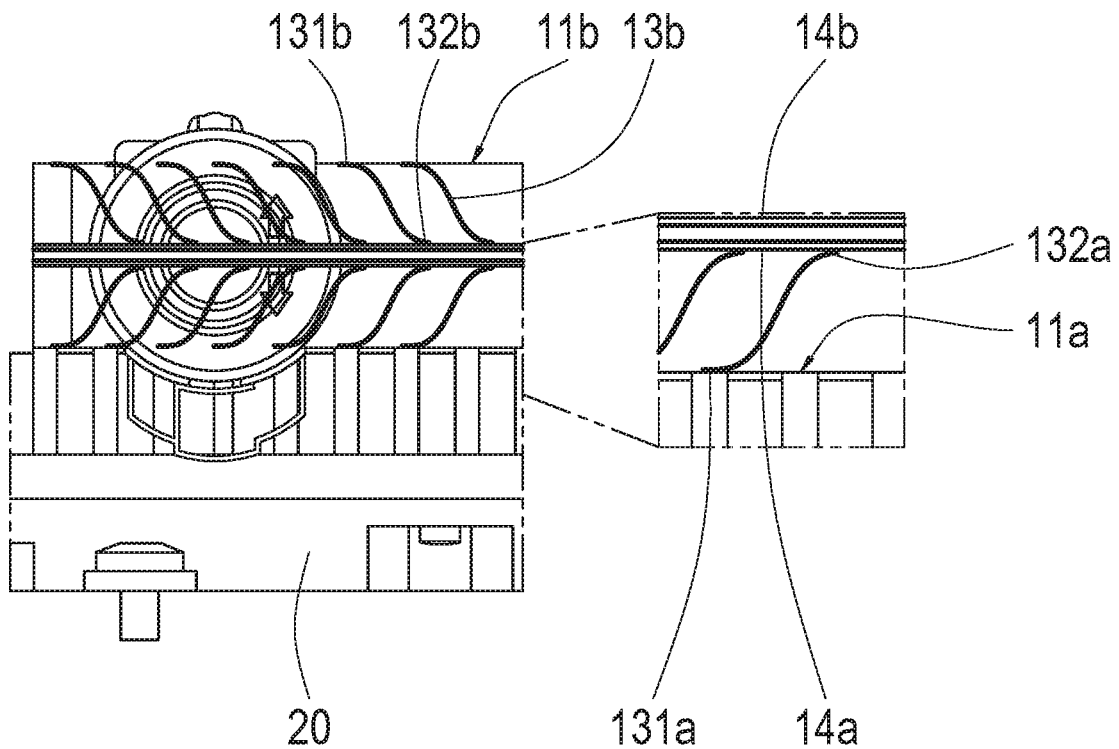
FIG. 3 shows an exemplary embodiment of a cooling module according to the invention with the two bimetals in a starting position.

FIG. 3 shows first cooling fins 13a and second cooling fins 13b. The first cooling fins 13a and second cooling fins 13b are placed above one another and are each wave- or S-shaped, wherein the shape of the second cooling fins 13b is vertically mirrored in relation to the shape of the first cooling fins 13a. The first cooling fins 13a are welded, for example, at a first end 131a to the first side 11a of the cooling element, and slide at a second end 132a toward a first bimetal 14a. The second cooling fins 13b are welded, for example, at a first end 131b to second side 11b of the cooling element 11, and slide at a second end 132b toward a second bimetal 14b. The arrangement of the first cooling fins 13a, second cooling fins 13b, first bimetal 14a and second bimetal 14b form a valve due to the temperature-dependent bending of the first bimetal 14a and second bimetal 14b. The valve is closed in FIG. 3. This corresponds to the state at temperatures above a threshold value. The valve is open in FIG. 4. This corresponds to the state at temperatures below the threshold value. The threshold value is −10° C., for example.

Figure 4:
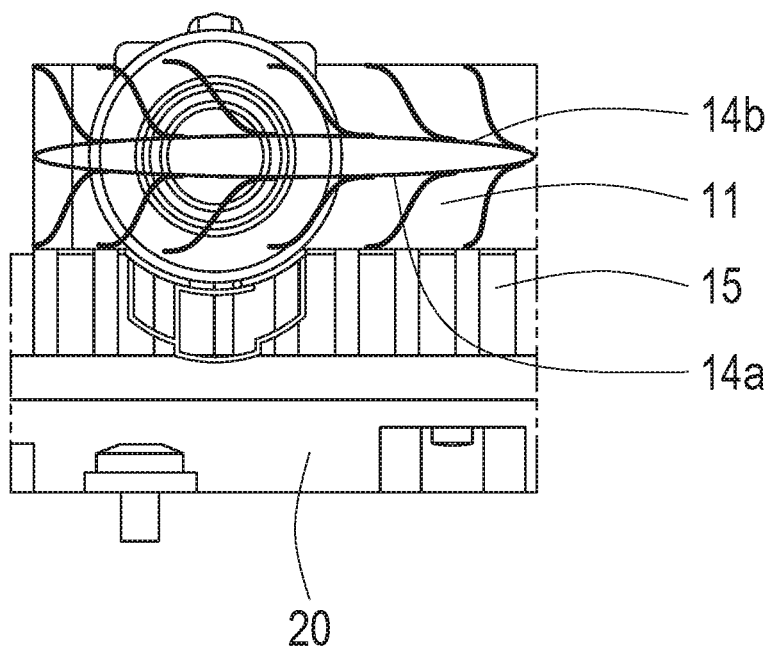
FIG. 4 shows the exemplary embodiment from FIG. 3 with the bimetals in a bent position.

When the valve formed by the first bimetal 14a and second bimetal 14b is open, see FIG. 4, heat is only dissipated via the thermal conductor 15 from the vehicle control unit 20 to the coolant via the first bimetal 14a and the first cooling fins 13a, but not via the second bimetal 14b with the second cooling fins 13b. At low temperatures, a highly efficient heat reduction is not yet needed.

In FIG. 3, when the first bimetal 14a and the second bimetal 14b lie opposite one another such that they are flush with one another, however, the thermal transition also takes place from the first bimetal 14a to the directly adjacent second bimetal 14b. This provides more surface area for the thermal reduction, thus improving the thermal reduction.

Figure 5:
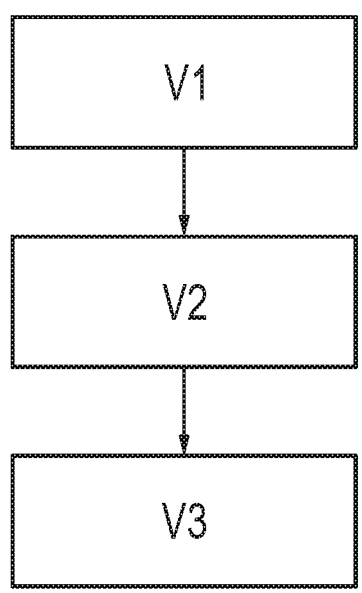
FIG. 5 shows an exemplary embodiment of a method according to the invention.

FIG. 5 illustrates the method according to the invention for water cooling the vehicle control unit 20. In a first step V1, the coolant is conducted through the cooling module 10. The cooling module 10 is in thermal contact with the vehicle control unit 20. In a second step V2, a turbulent flow of the coolant through the cooling module 10 is generated by means of the turbulence insert. In a second step V3, the volumetric flow rate of the coolant through the cooling module 10 is altered depending on the temperature by the change in shape of the first bimetal 14a and the second bimetal 14b.

REFERENCE SYMBOLS 10 cooling module
11 cooling element
11a first side
11b second side
12a connection
12b connection
13a cooling fin
131a first end
132a second end
13b cooling fin
131b first end
132b second end
14a bimetal
14b bimetal
15 thermal conductor
20 vehicle control unit
L longitudinal direction
V1-V3 method steps
I section line

The invention claimed is:

1. A cooling module for a vehicle control unit, comprising:
   a cooling element;
   connections, for conducting a coolant through the cooling element;
   a turbulence insert comprising at least a first set of cooling fins located on the cooling element; and
   at least a first bimetal located in the cooling element, wherein the first bimetal comprises two metals with different linear expansion coefficients connected to one another in a material bonding or form fitting manner,
   wherein the at least the first bimetal is placed such that it displaces the first set of cooling fins depending on a temperature-dependent change in shape of the at least the first bimetal,
   wherein the first set of cooling fins extend between the first bimetal and a sidewall of the cooling element in a direction transverse to a longitudinal direction of the cooling element,
   wherein a central axis of the first bimetal is parallel to the longitudinal direction of the cooling element,
   wherein the first bimetal includes a first end and a second end that is opposite to the first end across the first bimetal such that the central axis is located between and substantially parallel to the first end and the second end of the first bimetal, wherein the first end and the second end of the first bimetal are connected to the cooling element, and
   wherein a first end of the first set of cooling fins is connected to a first side of the cooling element, and a second end of the first set of cooling fins is located at the first bimetal, wherein the first set of cooling fins is configured to be displaced by a temperature-dependent bending of the first bimetal.

2. The cooling module according to claim 1, comprising:
   a second set of cooling fins;
   a second bimetal located in the cooling element, which is parallel to the first bimetal,
   wherein the second set of cooling fins extend between the second bimetal and a sidewall of the cooling element in a direction transverse to a longitudinal direction of the cooling element
   wherein a first end of the second set of cooling fins is connected to a second side of the cooling element lying opposite the first side of the cooling element, and a second end of the second set of cooling fins is located at the second bimetal, wherein the second set of cooling fins is configured to be displaced by a temperature-dependent bending of the second bimetal.

3. The cooling module according to claim 1, wherein the first set of cooling fins are at least one of welded or rivetted at their first ends to the cooling element.

4. The cooling module according to claim 1, wherein the first cooling fins are wave-shaped.

5. The cooling module according to claim 1, wherein the at least one bimetal has a lamellar structure.

6. A vehicle control unit comprising a cooling module according to claim 1.

7. The vehicle control unit according to claim 6, wherein the cooling module is flange-mounted on the vehicle control unit.

8. The vehicle control unit according to claim 6, wherein a thermal conductor is located between the vehicle control unit and the cooling module.

9. A method for water cooling a vehicle control unit, comprising:
   conducting a coolant through a cooling module via connections to the cooling module, wherein the cooling module is in thermal contact with the vehicle control unit and comprises:
      a cooling element;
      a turbulence insert comprising at least a first set of cooling fins located on the cooling element; and
      at least one bimetal located in the cooling element and configured to displace the first set of cooling fins depending on a temperature-dependent change in shape of the at least one bimetal, wherein the at least one bimetal comprises two metals with different linear expansion coefficients connected to one another in a material bonding or form fitting manner,
      wherein the first set of cooling fins extend between the at least one bimetal and a sidewall of the cooling element in a direction transverse to a longitudinal direction of the cooling element,
      wherein a central axis of the at least one bimetal is parallel to the longitudinal direction of the cooling element,
      wherein the at least one bimetal includes a first end and a second end that is opposite to the first end across the at least one bimetal such that the central axis is located between and substantially parallel to the first end and the second end of the at least one bimetal, wherein the first end and the second end of the at least one bimetal are connected to the cooling element, and
      wherein a first end of the first set of cooling fins is connected to a first side or a second side of the cooling element lying opposite the first side, and a second end of the first set of cooling fins is located at the at least one bimetal,
   generating a turbulent flow of the coolant through the cooling module by means of the turbulence insert; and
   altering the volumetric flow rate of the coolant through the cooling module by displacing the first set of cooling fins with the at least one bimetal depending on the temperature-dependent change in shape of the at least one bimetal.

* * * * *